US 8,975,712 B2

(12) United States Patent
Rashed et al.

(10) Patent No.: US 8,975,712 B2
(45) Date of Patent: Mar. 10, 2015

(54) DENSELY PACKED STANDARD CELLS FOR INTEGRATED CIRCUIT PRODUCTS, AND METHODS OF MAKING SAME

(71) Applicant: GLOBALFOUNDRIES Inc., Grand Cayman (KY)

(72) Inventors: Mahbub Rashed, Cupertino, CA (US); Juhan Kim, Santa Clara, CA (US); Yunfei Deng, Sunnyvale, CA (US); Suresh Venkatesan, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/893,524

(22) Filed: May 14, 2013

(65) Prior Publication Data
US 2014/0339647 A1 Nov. 20, 2014

(51) Int. Cl.
*H01L 27/092* (2006.01)
*H01L 21/336* (2006.01)
*H01L 27/088* (2006.01)
*H01L 21/8234* (2006.01)
*H01L 21/84* (2006.01)
*H01L 21/338* (2006.01)
*H01L 21/8238* (2006.01)
*G06F 17/50* (2006.01)

(52) U.S. Cl.
CPC ... *H01L 21/823431* (2013.01); *H01L 21/823821* (2013.01); *H01L 27/0886* (2013.01); *G06F 17/5072* (2013.01)
USPC ........... 257/401; 257/368; 257/369; 257/355; 257/288; 257/287; 257/E21.409; 257/E27.06; 257/E27.062; 257/E21.44; 257/E21.616; 438/283; 438/294

(58) Field of Classification Search
CPC . H01L 21/845; H01L 27/1211; H01L 29/785; H01L 21/76804; H01L 23/485; H01L 29/401; H01L 29/7834
USPC .................................................. 257/395–414
See application file for complete search history.

(56) References Cited

U.S. PATENT DOCUMENTS

| 8,003,466 | B2 * | 8/2011 | Shi et al. ........................ 438/283 |
| 2012/0187497 | A1 * | 7/2012 | Zhong et al. ................... 257/368 |
| 2013/0015529 | A1 * | 1/2013 | Zhong et al. ................... 257/369 |
| 2013/0228866 | A1 * | 9/2013 | Lee et al. ....................... 257/355 |

* cited by examiner

*Primary Examiner* — Marcos D. Pizarro
*Assistant Examiner* — Nelson Garces
(74) *Attorney, Agent, or Firm* — Amerson Law Firm, PLLC

(57) ABSTRACT

One method disclosed herein includes forming first and second transistor devices in and above adjacent active regions that are separated by an isolation region, wherein the transistors comprise a source/drain region and a shared gate structure, forming a continuous conductive line that spans across the isolation region and contacts the source/drain regions of the transistors and etching the continuous conductive line to form separated first and second unitary conductive source/drain contact structures that contact the source/drain regions of the first and second transistors, respectively. A device disclosed herein includes a gate structure, source/drain regions, first and second unitary conductive source/drain contact structures, each of which contacts one of the source/drain regions, and first and second conductive vias that contact the first and second unitary conductive source/drain contact structures, respectively.

15 Claims, 16 Drawing Sheets

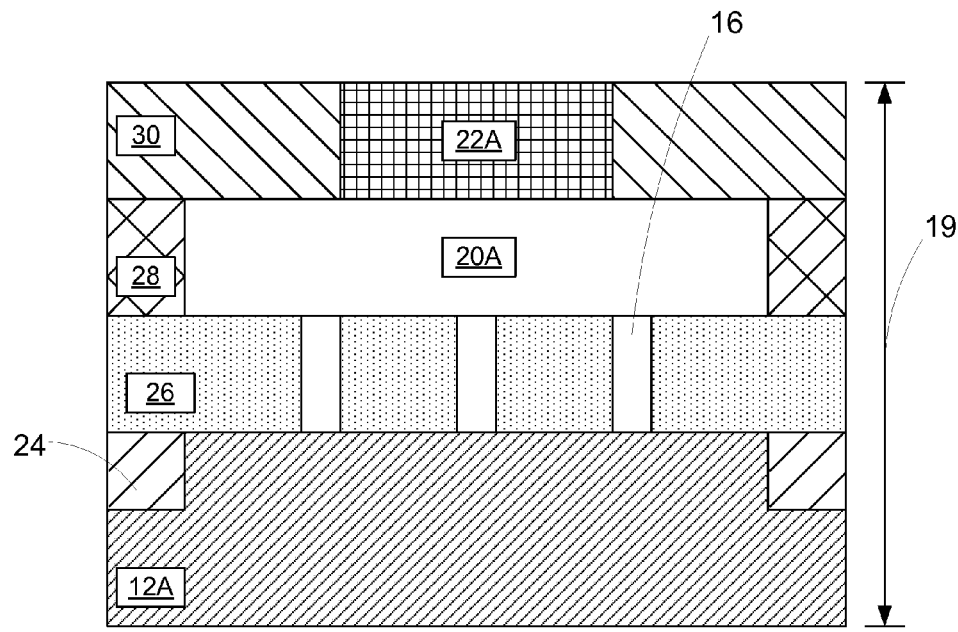
(Prior Art) Figure 1B
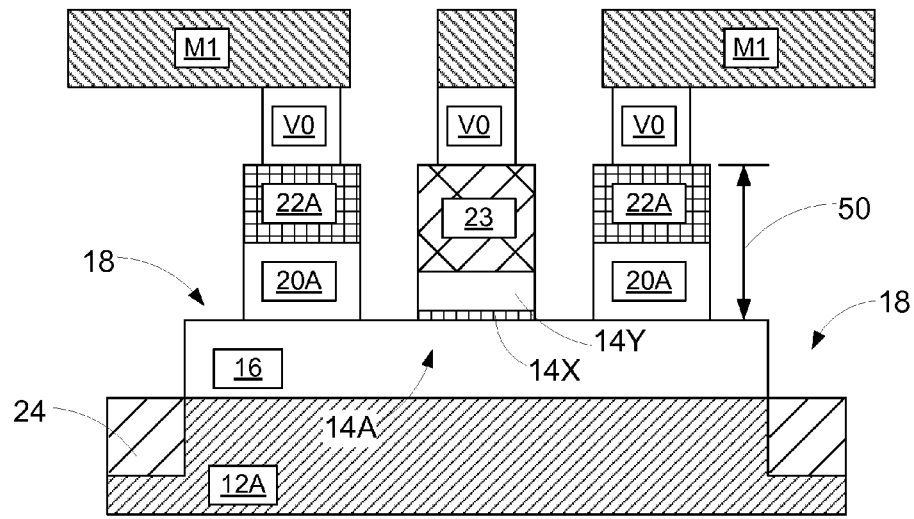
(Prior Art) Figure 1C

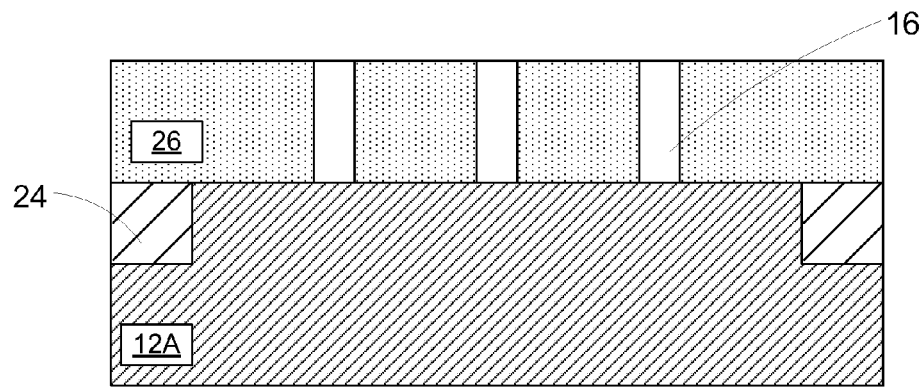
(Prior Art) Figure 2B
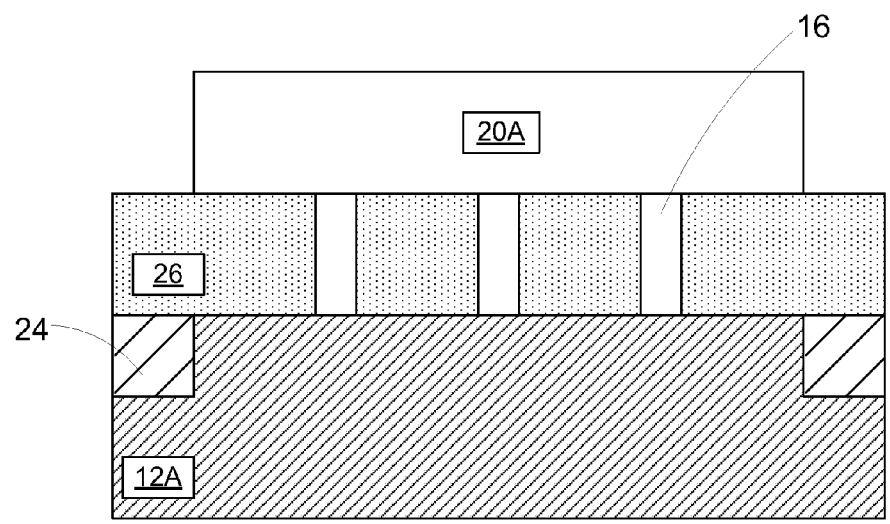
(Prior Art) Figure 2D

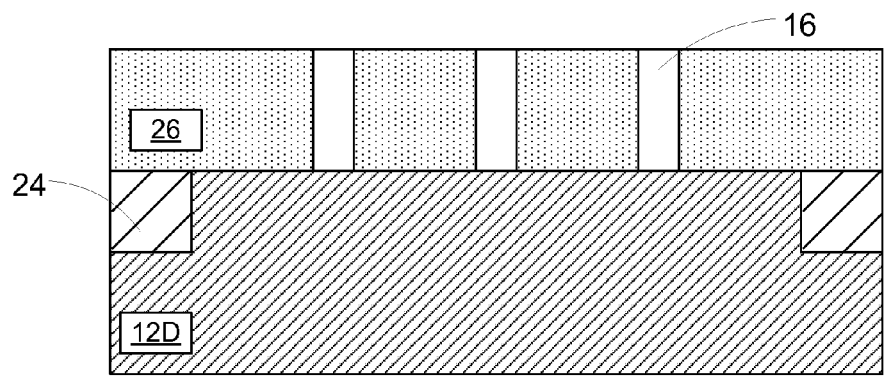
(Prior Art) Figure 2E
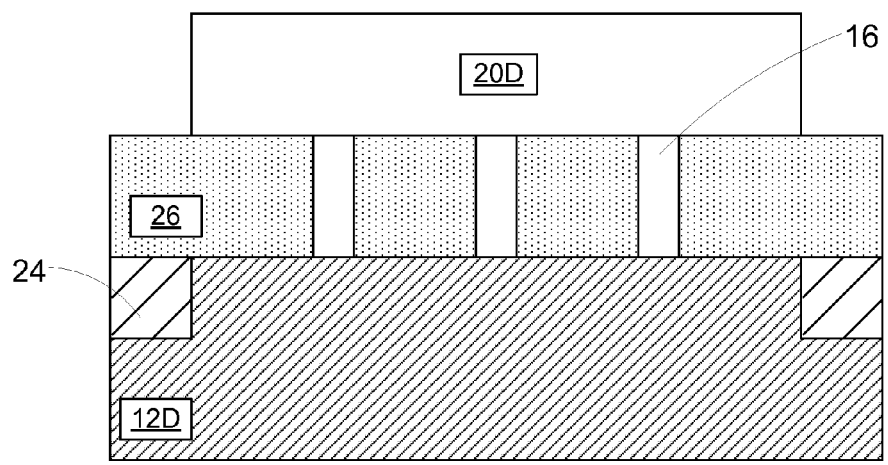
(Prior Art) Figure 2G

DENSELY PACKED STANDARD CELLS FOR INTEGRATED CIRCUIT PRODUCTS, AND METHODS OF MAKING SAME

BACKGROUND OF THE INVENTION

1. Field of the Invention

Generally, the present disclosure relates to the manufacture of semiconductor devices, and, more specifically, to densely packed standard cells for integrated circuit products and methods of making such products.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation and the "packing density" in such products has been increased over the recent years. i.e., there are an increased number of devices per unit area. Such improvements in the performance of transistor devices has reached the point where the limiting factor of the ultimate operating speed of complex integrated circuit products is no longer the individual transistor element but the electrical performance of the complex wiring system that is formed above the semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density has mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with the density of circuit elements in the device level.

As device dimensions have decreased, e.g., transistors with gate lengths of 50 nm and less, the contact elements in the contact level have to have critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

As device dimensions have continued to shrink over recent years, it is becoming more challenging to accurately and repeatedly manufacture integrated circuit products that meet performance criteria established for such integrated circuit products. Typically, semiconductor devices are formed on discrete islands of semiconducting substrate, i.e., active regions that are defined in the substrate by isolation structures. For example, FIGS. 1A-1B depict illustrative prior art standard cell pairs 10 and various conductive structures formed to establish electrical contact to source/drain regions. The illustrative prior art device is generally comprised of a so-called "top cell" and a "bottom cell". The standard cell pair 10 is intended to be representative in nature. For example, in one illustrative example, the top cell may be part of a combinational or sequential circuit and the bottom cell may also be part of a combinational or sequential circuit, etc. Examples of such combinational circuits include NAND, NOR, and inverter circuits, etc., while examples of sequential circuits include Scan FLOP, MUX, etc.

With continuing reference to FIG. 1A, the standard cell 10 is comprised of a plurality of spaced apart active regions 12A, 12B, 12C and 12D that are defined in a semiconductor substrate by one or more isolation structures, represented by the space between the active regions 12A-D. Semiconductor devices of different conductivity type may be formed above each of the active regions 12A-12D. For example, P-type devices may be formed in the active regions 12A, 12D, while N-type devices may be formed in the active regions 12B, 12C. In the depicted example, the transistor devices are FinFET type devices that are comprised of a plurality of fins 16. Of course, the number of fins may vary depending upon the particular application. In the depicted example, the devices formed above the active regions 12A-12B share a common gate structure 14A (gate electrode and gate insulation layer) while the devices formed above the active regions 12C-12D share a common gate structure 14B. Sidewall spacers that are typically formed adjacent the gate structures 14A, 14B are not depicted in the attached drawings. All of the devices have illustrative source/drain regions 18 formed in the fins 16. The source/drain regions 18 are formed by performing one or more ion implantation processes on the fins 16 after the gate structures 14A, 14B are formed. In the depicted example, the fins 16 are depicted as fins that have not been subjected to a so-called fin merger process whereby additional semiconductor material is formed on the fins 16 after the gate structures 14A, 14B are formed so as to hopefully provide a larger surface to which electrical contact can be made to the source/drain regions 18.

Also depicted in FIGS. 1A-1B are a plurality of conductive structures 20A-D and 22A-D that are formed to establish electrical contact to the source/drain regions 18. The reference numbers 20 and 22 may be used to generally refer to the conductive structures 20A-D and 22A-D, respectively. Reference FIG. 1B is a cross-sectional view of one illustrative embodiment of the conductive structures 20A, 22A taken where indicated in FIG. 1A. The conductive structures 20, 22 will have the same configuration on all of the devices. FIG. 1B also depicts an illustrative isolation structure 24 and a plurality of layers of insulating material 26, 28 and 30 that are formed above the active region 12A. The insulating materials 26, 28 and 30 are not depicted in the plan view shown in FIG. 1A so as to facilitate explanation of the device 10. In general, with reference to FIG. 1B, after the source/drain regions 18 are formed in the fins 16, the layer of insulating material 26 is deposited and a planarization process may then be performed on the layer of insulating material 26. Thereafter, the conductive structures 20A-D may be formed by depositing a layer of conductive material, e.g., tungsten, and thereafter patterning the deposited layer of conductive material to define the conductive structures 20A-D shown in FIG. 1A. The layer of insulating material 28 may then be deposited on the device and planarized. In some cases, the conductive structures 20 may be referred to within the industry as a so-called "trench silicide" structure. After the layer of insulating material 28 is planarized, the conductive structures 22A-D may be formed by depositing a layer of conductive material, e.g., tungsten, and thereafter patterning the deposited layer of conductive material to define the conductive structures 22A-D shown in FIG. 1A. The layer of insulating material 30 may then be deposited on the device and planarized. In some cases, the conductive structures 22 may also be referred to within the industry as a "CA contact."

FIG. 1C is a cross-sectional view taken through the middle fin 16 and the active region 12A, as indicated in FIG. 1A. The purpose of FIG. 1C is to show the stacking arrangement of various conductive structures that are formed to establish electrical contact to the FinFET device, and particularly to the source/drain regions 18 of the device. Various layers of insulating material that are formed to electrically insulate the various conductive structures are not depicted in FIG. 1C. The gate structure 14A is depicted as having an illustrative gate insulation layer 14X and gate electrode 14Y. Also depicted in FIG. 1C is an illustrative gate contact 23 that is conductively coupled to the gate structure 14A. The gate contact 23 is sometimes referred to within the industry as a "CB" contact. The gate contact 23 is typically formed after the formation of the conductive structures 22 using known processing techniques.

To establish electrical connection to the FinFET devices formed on the substrate, a plurality of stacked metallization layers are formed above the substrate. Essentially, these metallization layers constitute the electrical "wiring" that is used to electrically couple the circuits and devices formed on the substrate to one another so as to form a functional integrated circuit product. For example, a modern integrated circuit product may contain 7-10 or more metallization layers. The metallization layers are typically comprised of a plurality of conductive lines that are routed as needed so as to provide within-level or intra-level conductivity. The metallization layers are coupled to one another by a plurality of conductive structures, known as vias, that are typically formed in a separate layer of insulating material so as to provide electrical conductivity between metallization layers. The very first general metallization layer on an integrated circuit product is typically referred to within the industry as the "metal-1" or "M1" layer. The first via layer is typically referred to within the industry as the "via-zero" or "V0" layer. The V0 layer contains a plurality of conductive via structures that are used to establish electrical contact between the semiconductor devices/circuits formed in the substrate and the M1 layer. The conductive via structures may be formed in a variety of different configurations, cylindrical or square-shaped plugs, short line-type segments, etc. FIG. 1C depicts the V0 and M1 layers, which are not depicted in FIGS. 1A-1B so as to not complicate the discussion herein. As depicted in FIG. 1C, the conductive vias in the V0 layer are conductively coupled to the conductive structures 22 and the gate contact 23. The manner in which the conductive lines and vias are formed are well known to those skilled in the art.

With continuing reference to FIG. 1C, note that there are two separate conductive structures—the conductive structures 20A and 22A that are positioned between the V0 layer and the source drain regions 18. That is, this prior art technique required the formation of two separate conductive structures in order to establish electrical contact between the V0 layer and the source/drain regions 18. The combined height 50 of these two conductive structures (20A and 22A) may vary depending upon the particular application. In one illustrative embodiment, using current day technology, the combined thickness may be on the order of about 50-60 nm.

FIGS. 2A-2H depict one illustrative prior art method of forming the prior art standard cell 10 depicted in FIGS. 1A-1C. In FIGS. 2A-2H, the various layers of insulating material are not depicted in the plan drawings so as to facilitate explanation of one illustrative manner in which the device 10 may be formed.

FIG. 2A depicts the device 10 at a point in fabrication wherein active regions 24 (see FIG. 2B) have been formed in the substrate to define the active regions 12A-12D. The schematically depicted fins 16 and the gate structures 14A, 14B have also been formed at this point in the process flow. The fins 16 are typically formed by performing one or more etching processes to form a plurality of fin-formation trenches (not shown) in the substrate to define the fins 16. Thereafter, an insulating material is deposited so as to overfill the fin-formation trenches and a recess etching process is performed on the insulating material to reduce its thickness, which results in the formation of isolation regions (not shown) at the bottom of the fin-forming trenches. This recessing process typically exposes the fins 16 to the final desired fin height. After the fins 16 are formed, the schematically depicted gate structures 14A, 14B are formed. The gate structures 14A, 14B are typically comprised of a gate insulation material and one or more gate electrode materials. The gate structures 14A, 14B may be formed using so-called "gate-first" or "replacement-gate" techniques. In one particular example, the gate structures 14A, 14B may initially be formed by depositing the layers of the appropriate materials such that they cover all of the active areas 12A-D and the isolation materials therebetween and then patterning the layers of materials using a first gate etch masking layer (not shown) to define a single line of gate electrode material that spans across all of the active regions 12A-D. Thereafter, the first gate etch masking layer is removed and a second gate etch masking layer (not shown) is used to cut the single line of gate electrode material in the region indicated by the dashed lines 15 so as to thereby result in the depicted gate structures 14A, 14B. This second gate etch mask is sometimes referred to as a "gate-cut" mask. Thereafter, the source/drain regions 18 are formed by performing one or more ion implantation processes on the fins 16 after the gate structures 14A, 14B are formed. Sidewall spacers (not shown) may also be formed adjacent the gate structures 14A, 14B as part of the process of forming the source/drain regions 18. Of course, various masking layers will be used during the ion implantation processes to expose the fins where ions are to be implanted while covering other fins on different device types. In general, with reference to FIG. 2B, after the source/drain regions 18 are formed in the fins 16, the layer of insulating material 26 is deposited so as to overfill the fin-formation trenches and a planarization process may then be performed on the layer of insulating material 26.

With reference to FIG. 1A, tip-to-tip spacing 31 between the conductive features 20 is very small and typically exceeds what can be directly patterned using a single patterned etch mask layer with existing photolithography equipment. Thus, the four illustrative conductive structures 20A-D are formed using a double patterning technique that involves two separate masking-patterning operations. For example, as shown in FIG. 2C, the spaced-apart conductive structures 20A and 20C have been formed above the active regions 12A, 12C by performing a first deposition/masking/etching process. The tip-to-tip spacing 33 between the spaced-apart conductive structures 20A and 20C is large enough so that the structures 20A, 20C can be readily patterned using a single etch mask layer. FIG. 2D is a cross-sectional view that shows the formation of the illustrative conductive structures 20A above the active region 12A at this point in the process flow. Similar conductive structures 20C are formed above the active region 12C at this time as well. FIG. 2E is a cross-sectional view that shows the absence of the conductive structures 20D that will ultimately be formed above the active region 12D at this point in the process flow. Note the absence of the conductive structures 20B (that will eventually be formed above the active region 12B) at this point in the process flow as well.

As shown in FIG. 2F a second deposition/masking/etching process sequence is performed to form the spaced-apart conductive structures 20B and 20D above the active regions 12B, 12D. The tip-to-tip spacing 35 between the spaced-apart conductive structures 20B and 20D is large enough so that the structures 20B, 20D can be readily patterned using a single masking layer. FIG. 2G is a cross-sectional view that shows the formation of the illustrative conductive structures 20D above the active region 12D at this point in the process flow. Similar conductive structures 20B are formed above the active region 12B at this time as well. Thus, at this point in the process flow, two separate etch mask layers were required to form the conductive structures 20A-D due to the tight tip-to-tip spacing between the structures 20A-20D. At this point, the layer of insulating material 28 (see FIG. 1B) may be deposited on the device 10 and planarized.

As shown in FIG. 2H, the next process operation involves the formation of the conductive structures 22 on the device 10. The tip-to-tip spacing 32 between the conductive structures 22, while small, is still large enough to permit forming all eight of the illustrative conductive structures 22 shown in FIG. 2H by performing a single deposition/masking/etching process sequence using a single masking layer. At this point, the layer of insulating material 30 (see FIG. 1B) may be deposited on the device 10 and planarized.

Thus, using the above-described prior art technique, at this stage, three separate masking layers were required to form the conductive structures 20, 22 on the product 10: the two masking layers used in forming the conductive structures 20A-D and the single masking layer used in forming the conductive structures 22A-D.

The present disclosure is directed to densely packed standard cells for integrated circuit products and methods of making such products that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to densely packed standard cells for integrated circuit products and methods of making such products. One illustrative device disclosed herein includes a gate structure, a plurality of source/drain regions, first and second unitary conductive source/drain contact structures, each of which contacts one of the plurality of source/drain regions, and a via layer comprised of first and second conductive vias that contact the first and second unitary conductive source/drain contact structures, respectively.

One illustrative method disclosed herein includes forming first and second transistor devices in and above adjacent first and second active regions that are separated by an isolation region formed in a semiconductor substrate, wherein the first and second transistors comprise at least one source/drain region and a shared gate structure, forming a continuous conductive line that spans across the isolation region, wherein the continuous conductive line contacts the at least one source/drain region of each of the first and second transistors, and performing an etching process through a patterned mask layer on the at least one continuous conductive line to form separated first and second unitary conductive source/drain contact structures, wherein the first and second unitary conductive source/drain contact structures contact the at least one source/drain region of the first and second transistors, respectively.

Another illustrative method disclosed herein includes forming first and second transistor devices in and above adjacent first and second active regions that are separated by an isolation region formed in a semiconductor substrate, wherein the first and second transistors comprise at least one source/drain region and a shared gate structure, performing a first etching process through a first patterned mask layer to form a continuous conductive line that spans across the isolation region, wherein the continuous conductive line contacts the at least one source/drain region of each of the first and second transistors, removing the first patterned mask layer and performing at least one second etching process through a second patterned mask layer on the at least one continuous conductive line to form separated first and second unitary conductive source/drain contact structures, wherein the first and second unitary conductive source/drain contact structures contact the at least one source/drain region of the first and second transistors, respectively.

Yet another illustrative method disclosed herein includes forming first, second, third and fourth spaced-apart active regions in a semiconductor substrate, forming first, second, third and fourth transistor devices in and above the first, second, third and fourth active regions, respectively, wherein each of the transistors comprises at least one source/drain region, forming a first shared gate structure for the first and second transistors above the first and second active regions, forming a second shared gate structure for the third and fourth transistors above the third and fourth active regions, performing a first etching process through a first patterned mask layer to form a continuous conductive line that spans across the first, second, third and fourth active regions, wherein the continuous conductive line contacts the at least one source/drain region of each of the first, second, third and fourth transistors, removing the first patterned mask layer, performing at least one second etching process through a second patterned mask layer on the at least one continuous conductive line to form a first plurality of separated unitary conductive source/drain contact structures, respectively, removing the second patterned mask layer, performing at least one third etching process through a third patterned mask layer on the remaining portions of the at least one continuous conductive line to form a second plurality of unitary conductive source/drain contact structures and forming a via layer comprised of a plurality of conductive vias that collectively contact the first and second plurality of unitary conductive source/drain contact structures.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict an illustrative prior art standard cell and the conductive structures formed to establish electrical contact to source/drain regions;

FIGS. 2A-2H depict one illustrative prior art method of forming the prior art standard cell depicted in FIGS. 1A-1C;

Figure 1A:
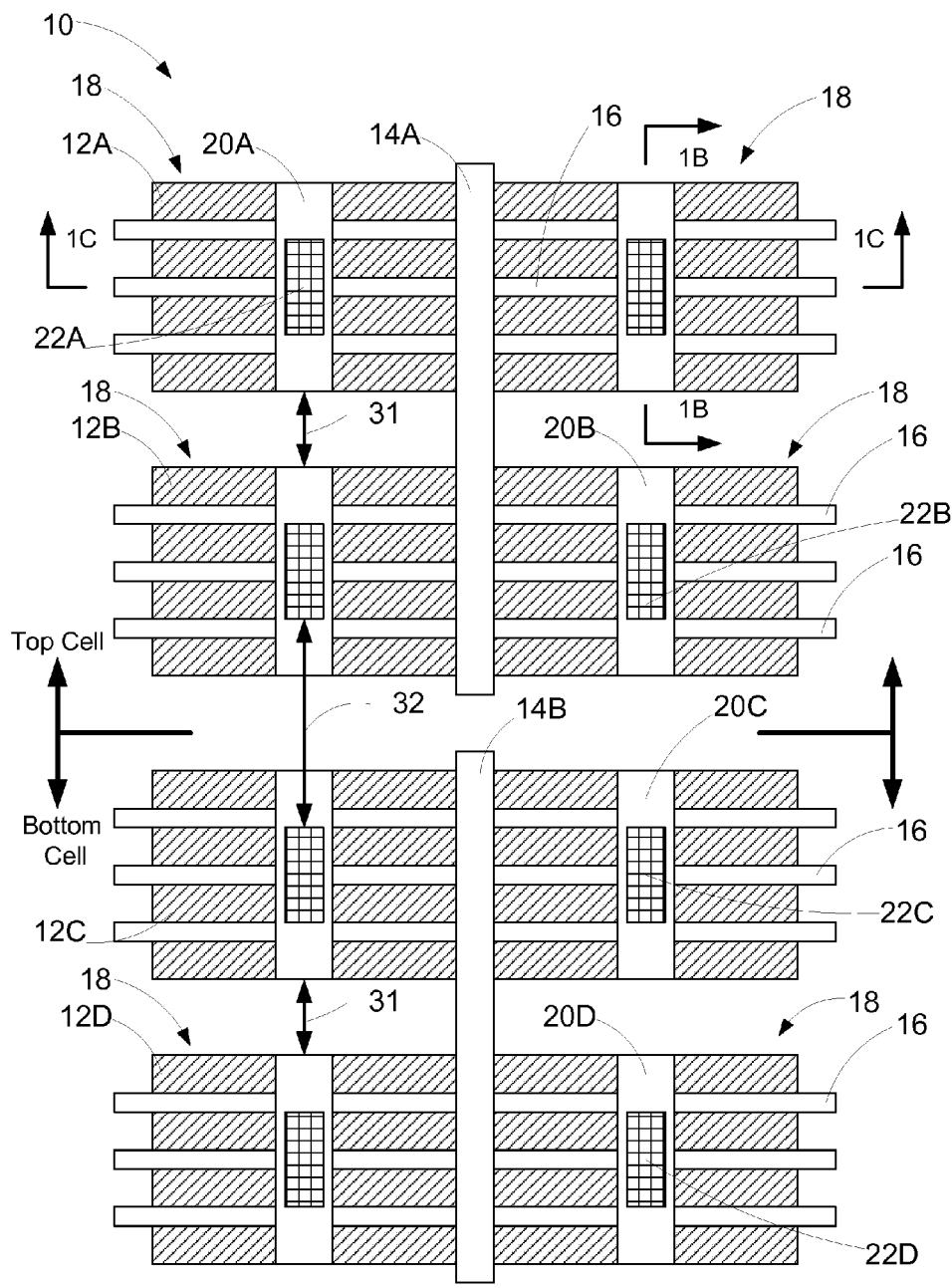
Figure 2A:
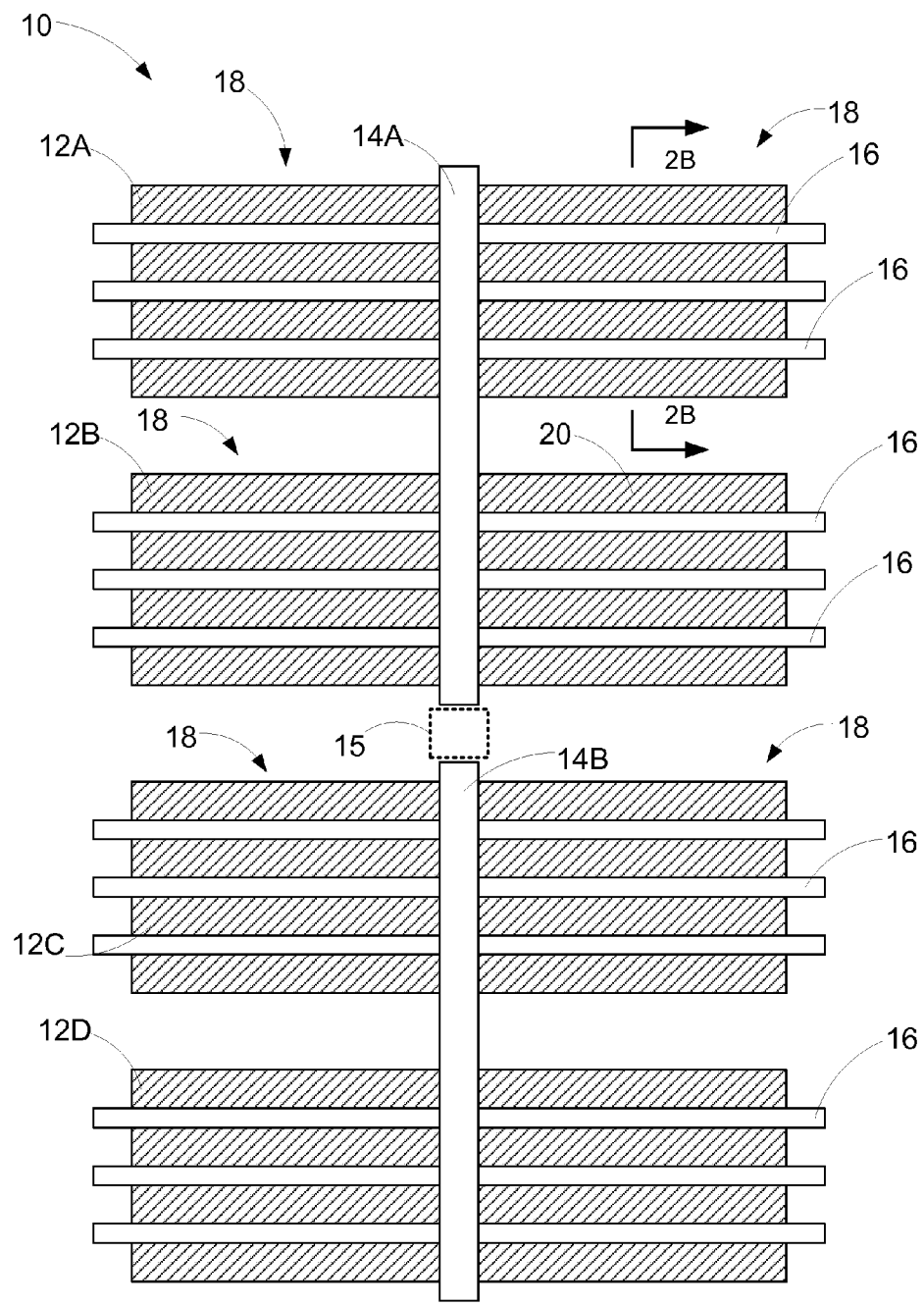
Figure 2C:
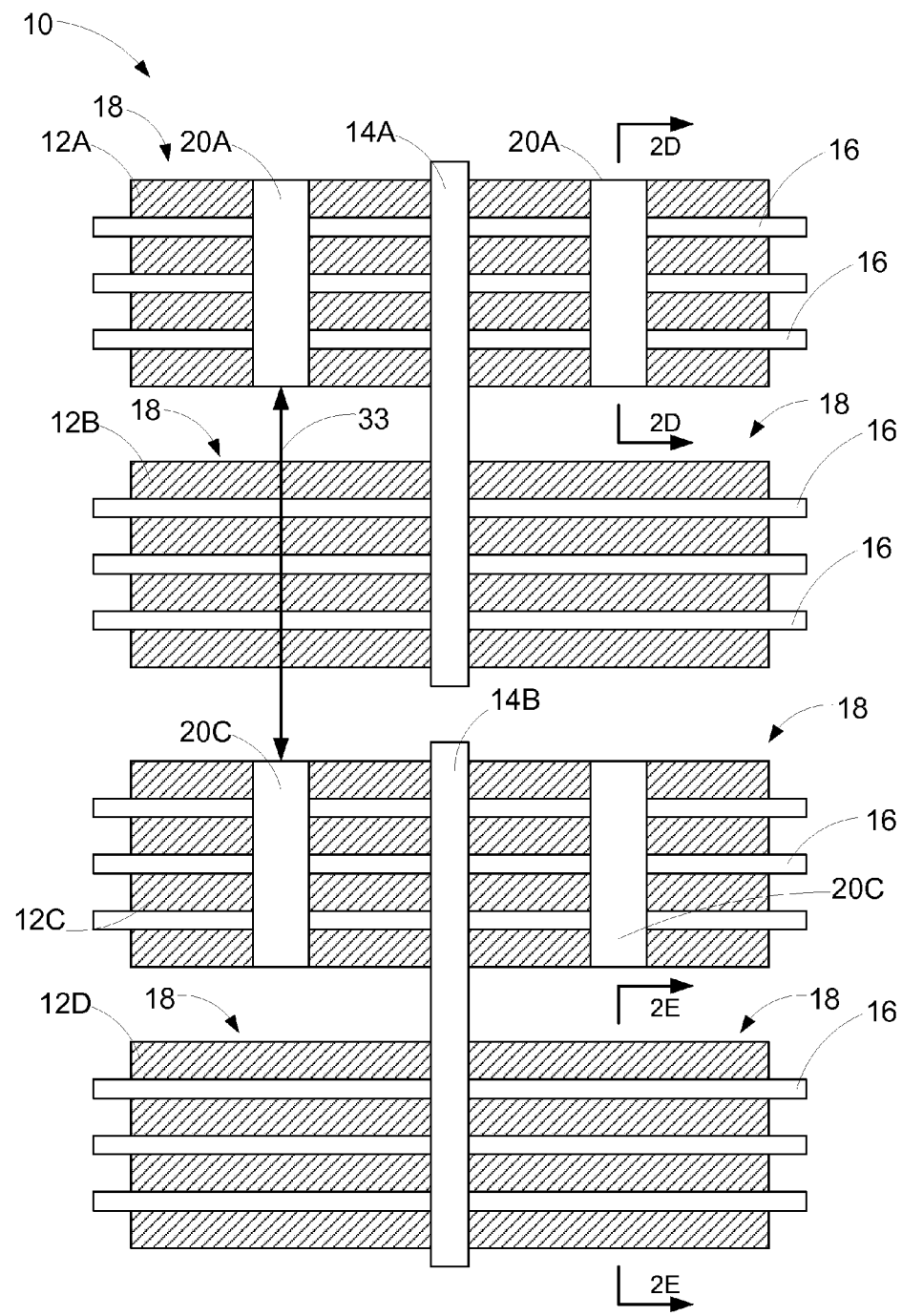
Figure 2F:
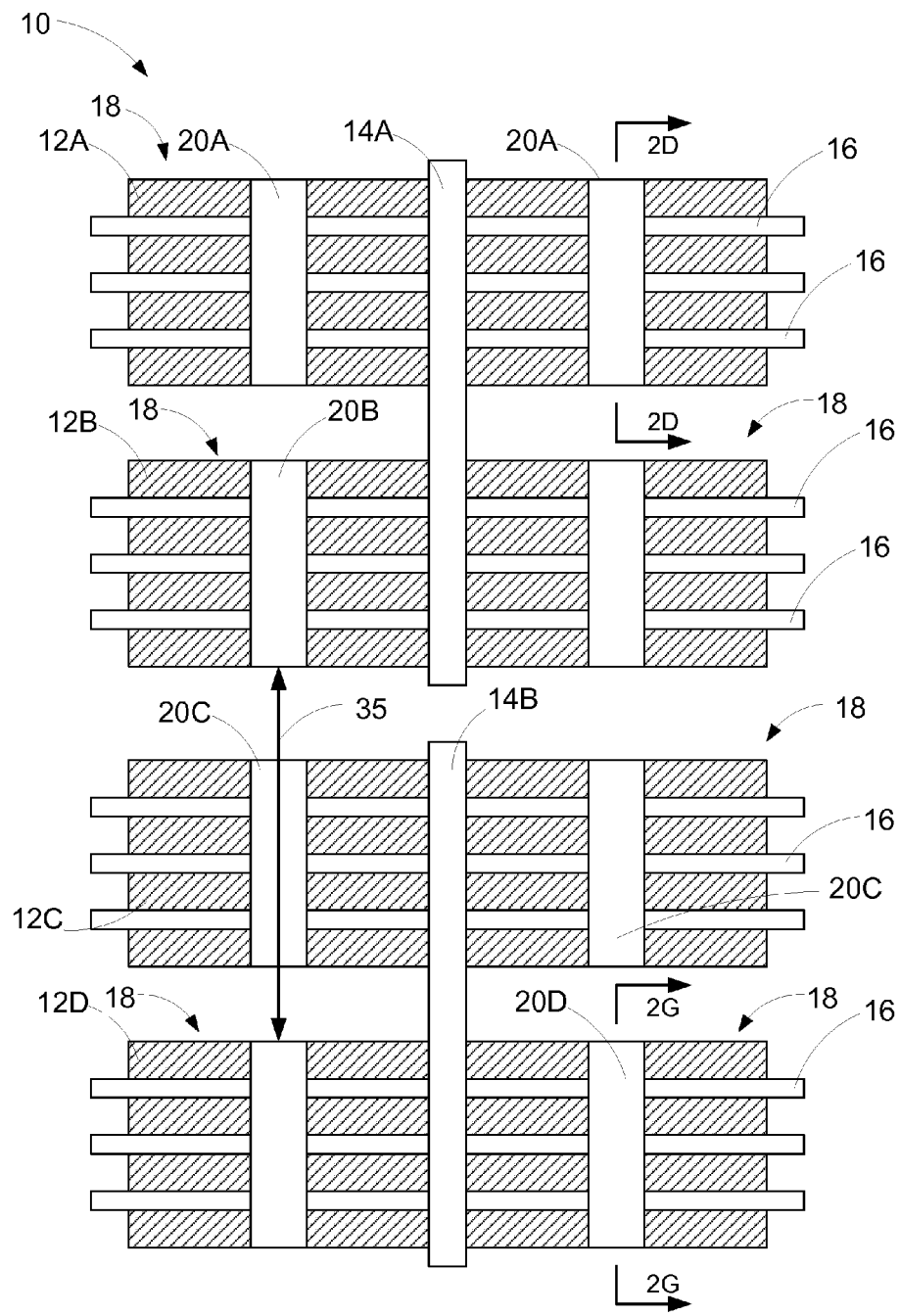
Figure 2H:
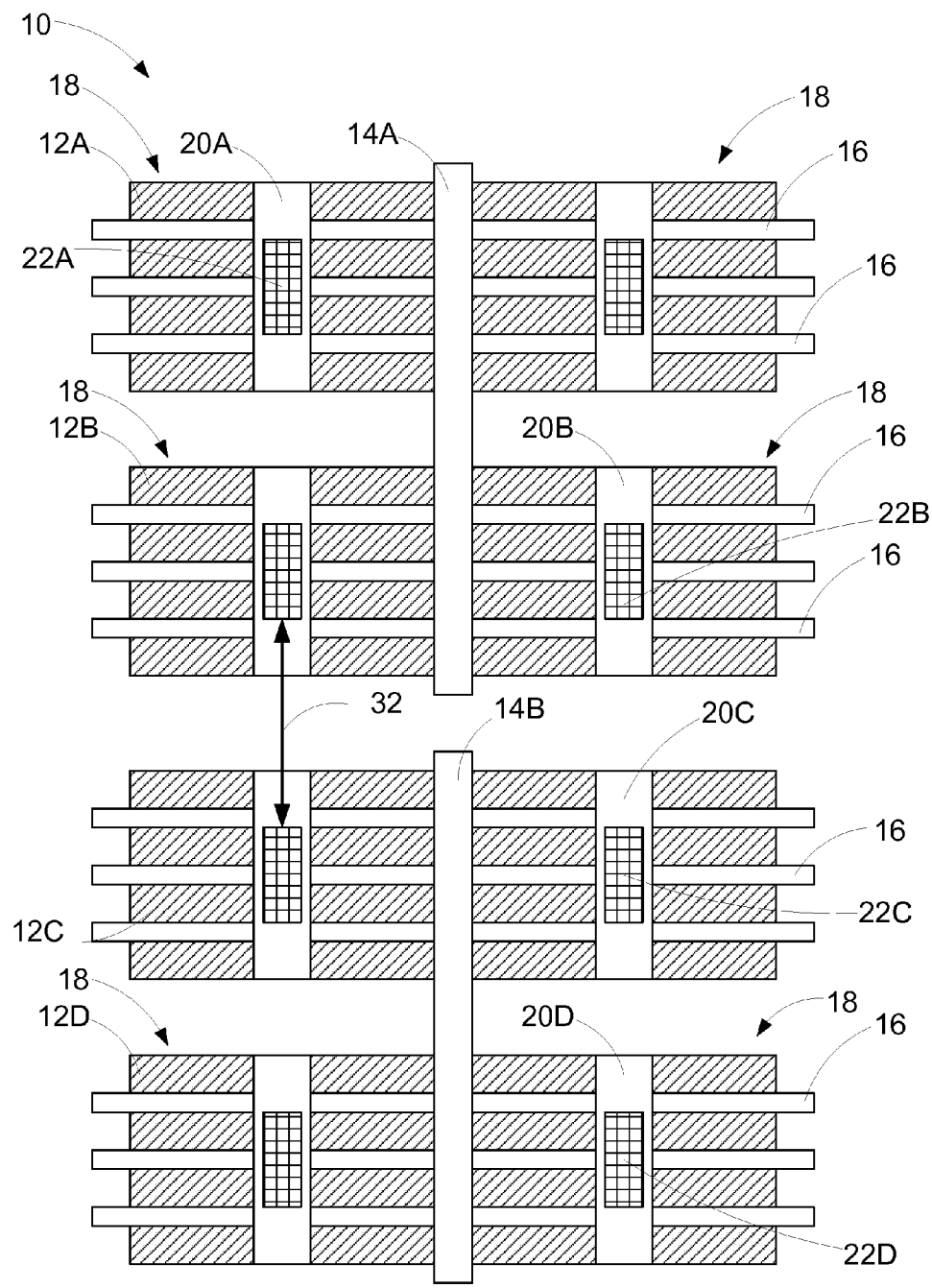

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to densely packed standard cells for integrated circuit products and methods of making such products. As will be readily apparent to those skilled in the art upon a complete reading of the present application, the presently disclosed subject matter may be used with a variety of different devices and technologies, e.g., NFET, PFET, CMOS, etc., and it may be readily employed on a variety of integrated circuit products, including, but not limited to, ASIC's, logic devices, memory devices, etc. With reference to the attached drawings, various illustrative embodiments of the devices and methods disclosed herein will now be described in more detail.

Figure 3A:
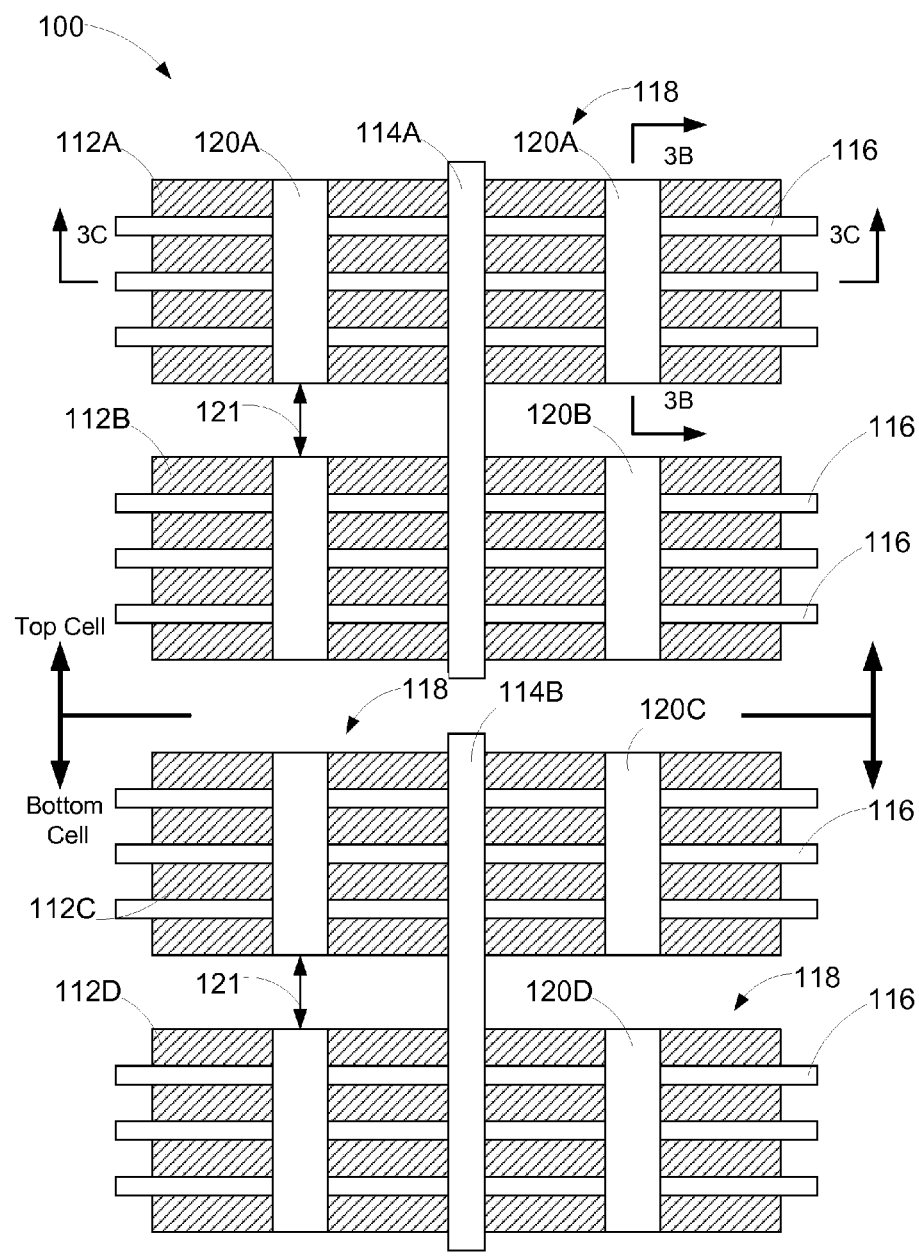
FIGS. 3A-3C depict one illustrative embodiment of a novel standard cell disclosed herein and a novel configuration of the conductive structures that are formed to establish electrical contact to source/drain regions of the devices.
Figure 3B:
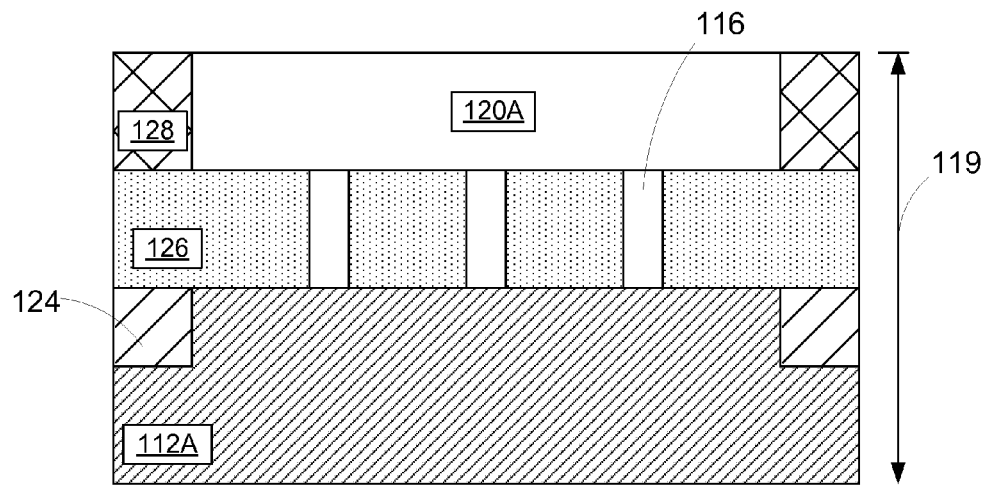
Figure 3C:
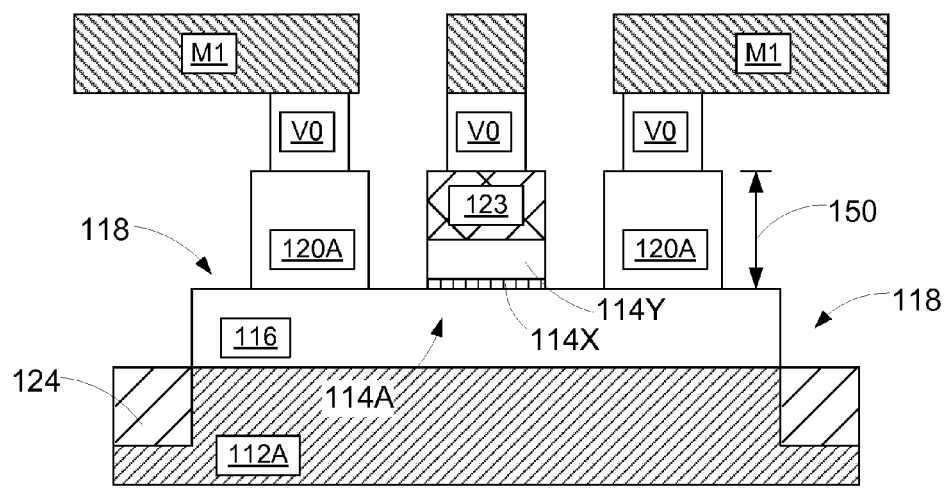

FIGS. 3A-3C depict one illustrative embodiment of an integrated circuit product or device 100 that includes one example of a novel standard cell 100 disclosed herein formed in and above a semiconductor substrate. As shown in FIG. 3A, one illustrative embodiment of a novel standard cell device 100 disclosed herein has a so-called "top cell" and a "bottom cell". The standard cell depicted in the following drawing is intended to be representative in nature. The substrate may take the form of a silicon-on-insulator (SOI) substrate that is comprised of a bulk substrate, a buried insulation layer (a so-called BOX layer) and an active layer positioned above the box layer. In such an embodiment, the active regions would be formed in the active layer. The substrate may also be in bulk form. The substrate may also be made of materials other than silicon. Thus, the terms "substrate" or "semiconductor substrate" as used herein and in the appended claims should be understood to cover all forms of any type of semiconductor material.

With continuing reference to FIG. 3A, the standard cell is comprised of a plurality of separate, spaced-apart active regions 112A, 112B, 112C and 112D that are defined in the semiconductor substrate by one or more isolation structures, represented by the space between the active regions 112A-D. Semiconductor devices of different conductivity type may be formed above each of the active regions 112A-D. For example, N-type devices may be formed in the active regions 112A, 112D, while P-type devices may be formed in the active regions 112B, 112C. In the depicted example, the transistor devices are FinFET type devices that are comprised of a plurality of schematically depicted fins 116. The number of fins 116 that are formed above each of the active regions 112A-D may vary depending upon the particular application. In the depicted example, the devices formed above the active regions 112A-B share a common gate structure 114A (comprised of a gate electrode and gate insulation layer) while the devices formed above the active regions 112C-D share a common gate structure 114B. The gate structures 114A-B may be formed using the same techniques as those described above with respect to the gate structures 14A, 14B described in the background section of this application. Sidewall spacers that are typically formed adjacent the gate structures 114A, 114B are not depicted in the attached drawings. All of the devices have illustrative source/drain regions 118 formed in the fins 116. The source/drain regions 118 are formed by performing one or more ion implantation processes on the fins 116 after the gate structures 114A, 114B are formed. In the depicted example, the fins 116 are depicted as fins that have not been subjected to a so-called fin merger process whereby additional semiconductor material is formed on the fins 116 after the gate structures 114A, 114B are formed so as to hopefully provide a larger surface to which electrical contact can be made to the source/drain regions 118.

FIG. 3B depicts an illustrative isolation structure 124 and a plurality of layers of insulating material 126 and 128 that are formed above the active region 112A. The insulating materials 126, 128 are not depicted in the plan view shown in FIG. 3A so as to facilitate explanation of the device 100. In general, with reference to FIG. 3B, after the source/drain regions 118 are formed in the fins 116, the layer of insulating material 126 is deposited and a planarization process may then be performed on the layer of insulating material 126. Thereafter, the novel unitary conductive source/drain contact structure 120A disclosed herein may be formed using the novel techniques described more fully below. After the unitary conductive source/drain contact structure 120A is formed, a layer of insulating material 128 is deposited and a planarization process may then be performed on the layer of insulating material 128 to arrive at the structure depicted in FIG. 3B.

FIG. 3C is a cross-sectional view taken through the middle fin 116 and the active region 112A, as indicated in FIG. 3A. The purpose of FIG. 3C is to show the stacking arrangement of various conductive structures that are formed to establish electrical contact to the FinFET device, and particularly to the source/drain regions 118 of the device. Various layers of insulating material that are formed to electrically insulate the various conductive structures are not depicted in FIG. 3C. The gate structure 114A is depicted as having an illustrative gate insulation layer 114X and an illustrative gate electrode 114Y. Also depicted in FIG. 3C is an illustrative gate contact 123 that is conductively coupled to the gate structure 114A. The gate contact 123 is sometimes referred to within the industry as a "CB" contact. The gate contact 123 will be formed after the formation of the unitary conductive source/drain contact structures 120A-D disclosed herein using known processing techniques. FIG. 3C depicts the V0 and M1 layers, which are not depicted in FIGS. 3A-3B so as to not obscure the inventions disclosed. As depicted in FIG. 3C, the conductive vias in the V0 layer contact the unitary conductive source/drain contact structure 120A and the gate contact 123.

With continuing reference to FIG. 3C, note that there is only a single conductive source/drain structure—the unitary conductive source/drain contact structure 120A positioned between the V0 layer and the source drain regions 118. That is, using the novel method disclosed herein, only a single unitary conductive source/drain contact structure 120, i.e., the conductive structure 120A is required in order to establish electrical contact between the V0 layer and the source/drain regions 118. The overall height 150 of this single unitary conductive source/drain contact structure 120A is less than the combined height 50 (see FIG. 1C) of the two separate conductive structures 20A, 22A that were formed using the prior art technique discussed in the background section of this application. The height 150 may vary depending upon the particular application. In one illustrative embodiment, using current day technology, the height 150 may be on the order of about 30-40 nm. Importantly, using the novel methods and unitary conductive source/drain contact structures 120A-D disclosed herein, the height 150 may typically be about 30-40 nm less than the combined thickness 50 of the conductive structures 20, 22 on the prior art device 10 discussed above.

As will be recognized by those skilled in the art after a complete reading of the present application, using the novel methods disclosed herein, the novel unitary conductive source/drain contact structures 120A-D for establishing electrical contact between the V0 layer and the source/drain regions 118 are formed in a single metallization layer, e.g., the metallization layer containing the layer of insulating material 128. As noted above, this is in stark contrast to the methodology and device 10 referenced in the background section of this application wherein two conductive structures 20, 22 were required to be formed in two separate metallization layers (26 and 28) to establish electrical contact between the V0 layer and the source/drain regions 18. Accordingly, using the novel methods and devices disclosed herein, the overall vertical height 119 (see FIG. 3B) of the device 100 disclosed herein will be less than the overall vertical height 19 of the prior art device 10 (see FIG. 1B). The reduction in vertical height of the novel device 100 disclosed herein will tend to reduce the overall capacitance of the device 100 as compared to the prior art device 10. Note that the attached drawings are not to scale. It should be understood that, when it is stated in the specification and in the claims that the conductive source/drain contact structures 120A-D "contact" the source/drain region 118, the unitary conductive source/drain contact structures 120A-D may contact a conductive material, such as a metal silicide material. Similarly, when it is stated herein that the unitary conductive source/drain contact structures 120A-D contact a conductive via in the V0 layer, such a statement should be understood to include situations where a conductive liner or the like may be positioned between the unitary conductive source/drain contact structure and the conductive via.

FIGS. 4A-4G depict one illustrative method disclosed herein of forming the novel standard cell 100 depicted in FIGS. 3A-3C. In FIGS. 4A-4G, the various layers of insulating material are not depicted in the plan drawings so as to facilitate explanation of one illustrative manner in which the device 100 may be formed.

Figure 4A:
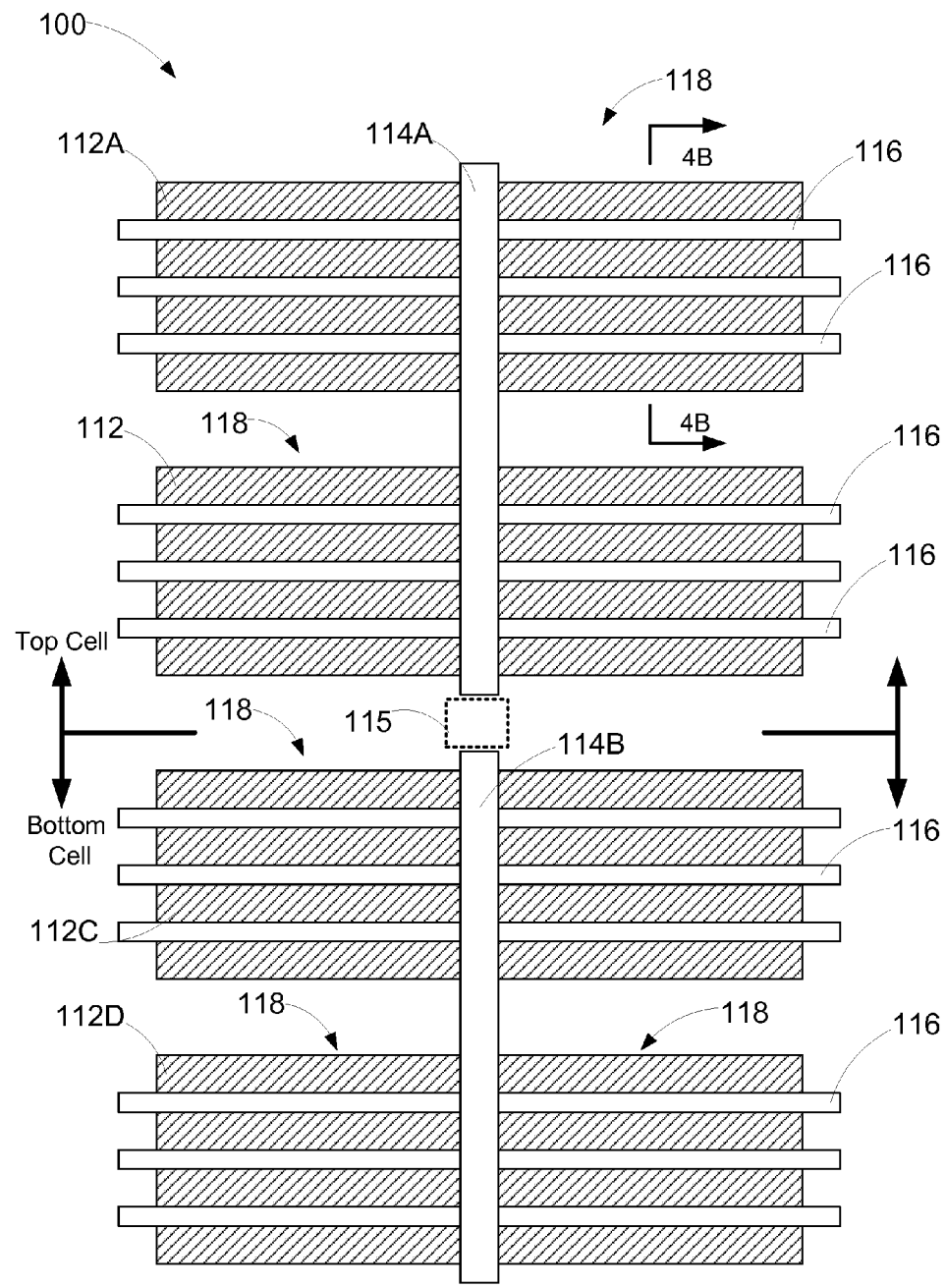
FIGS. 4A-4G depict one illustrative method disclosed herein of forming the novel standard cell depicted in FIGS. 3A-3C.
Figure 4B:
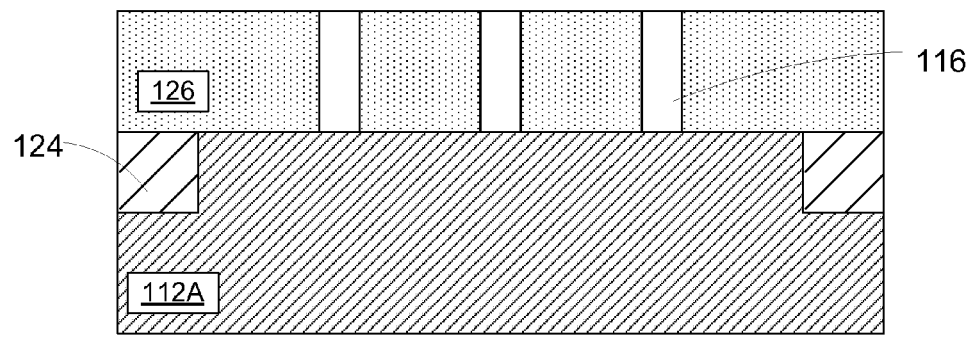

FIG. 4A depicts the device 100 at a point in fabrication wherein isolation regions 124 (see FIG. 3B) have been formed in the substrate to define the active regions 112A-D. The schematically depicted fins 116 and the gate structures 114A, 114B have also been formed at this point in the process flow. The fins 116 are typically formed by performing one or more etching processes to form a plurality of fin-formation trenches (not shown) in the substrate to define the fins 116. Thereafter, an insulating material (not shown) is deposited so as to overfill the fin-formation trenches and a recess etching process is performed on the insulating material to reduce its thickness, which results in the formation of isolation regions (not shown) at the bottom of the fin-forming trenches. This recessing process typically exposes the fins 116 to the final desired fin height. After the fins 116 are formed, the schematically depicted gate structures 114A, 114B are formed. The gate structures 114A, 114B are typically comprised of at gate insulation material and one or more gate electrode materials. The gate structures 114A, 114B may be formed using so-called "gate-first" or "replacement-gate" techniques. In one particular example, the gate structures 114A, 114B may initially be formed by depositing the layers of the appropriate materials such that they cover all of the active areas 12A-D and the isolation materials therebetween and then patterning the layers of materials using a first gate etch masking layer (not shown) to define a single line of gate electrode material that spans across all of the active regions 112A-D. Thereafter, the first gate etch masking layer is removed and a second gate etch masking layer (not shown) is used to cut the single line of gate electrode material in the region indicated by the dashed lines 115 so as to thereby result in the depicted gate structures 114A, 114B. This second gate etch mask layer is sometimes referred to as a "gate-cut" mask. Thereafter, the source/drain regions 118 are formed by performing one or more ion implantation processes on the fins 116 after the gate structures 114A, 114B are formed. Sidewall spacers (not shown) may also be formed adjacent the gate structures 114A, 114B as part of the process of forming the source/drain regions 118. Of course, various masking layers will be used during the ion implantation processes to expose the desired fins 116 to be implanted while covering other fins 116 on different device types. In general, with reference to FIG. 4B, after the source/drain regions 118 are formed in the fins 116, the layer of insulating material 126 is deposited so as to overfill the fin-formation trenches and a planarization process may then be performed on the layer of insulating material 126 so as to result in the structure depicted in FIG. 4B.

Figure 4D:
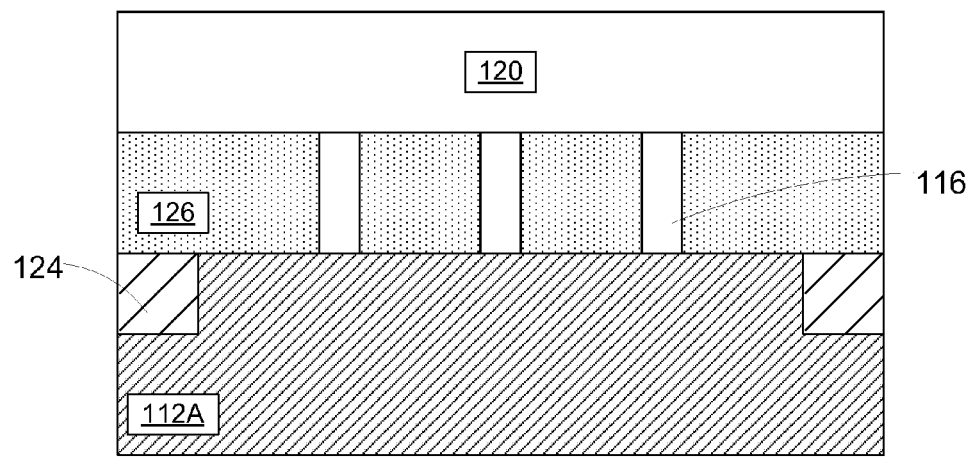
Figure 4C:
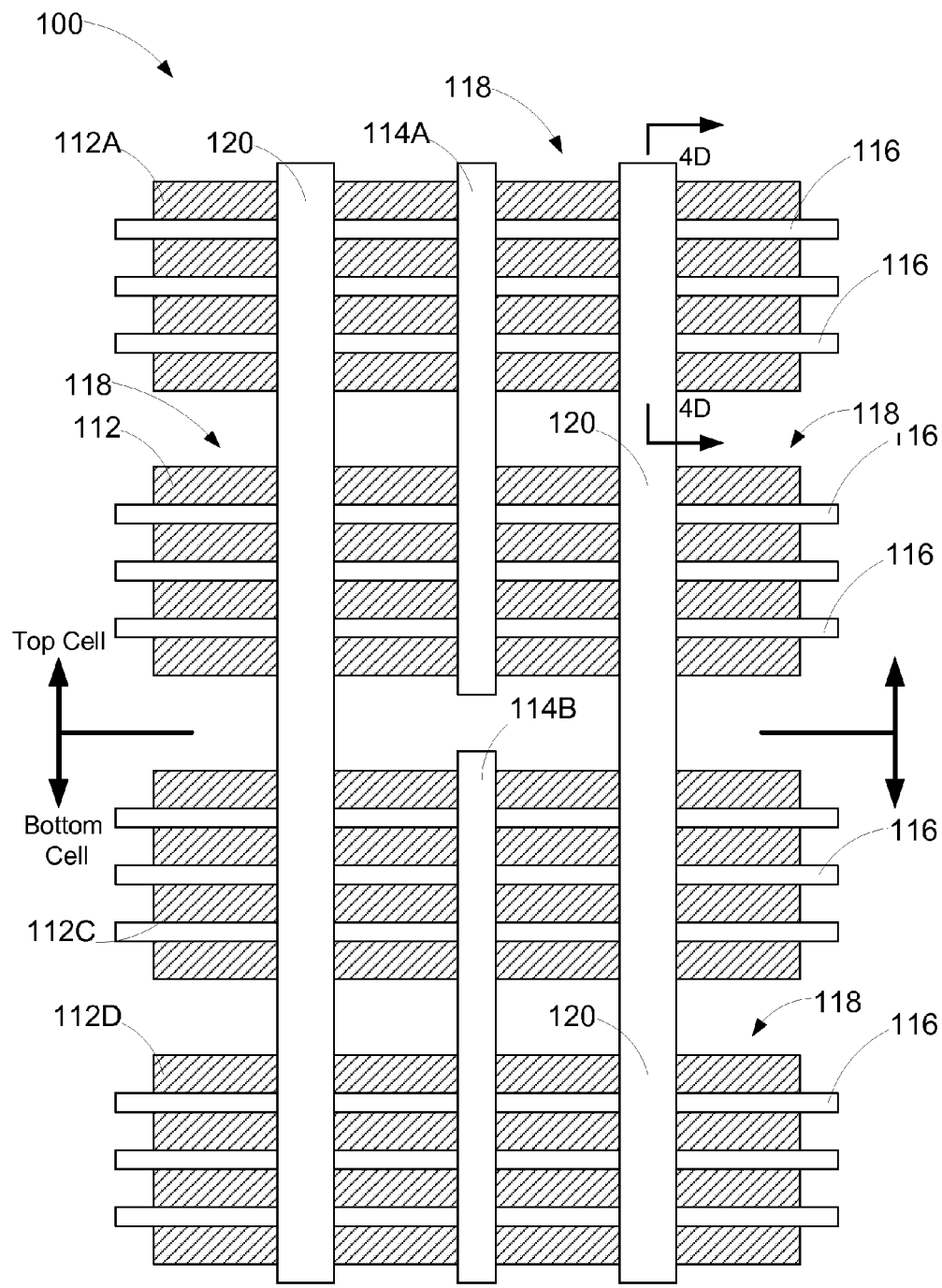

FIGS. 4C-D depict the device 100 after a continuous line of conductive material 120, e.g., a metal such as tungsten, has been formed so as to contact the source/drain regions 118. As depicted, in one embodiment, the single line of conductive material 120 spans all four active regions 112A-D. The line of conductive material 120 may be formed by depositing the appropriate layer or layers of conductive material and thereafter patterning the layer of conductive material through a first patterned etch mask (not shown), such as a patterned layer of photoresist material, to define the continuous lines of conductive material 120 depicted in FIG. 4C.

Figure 4E:
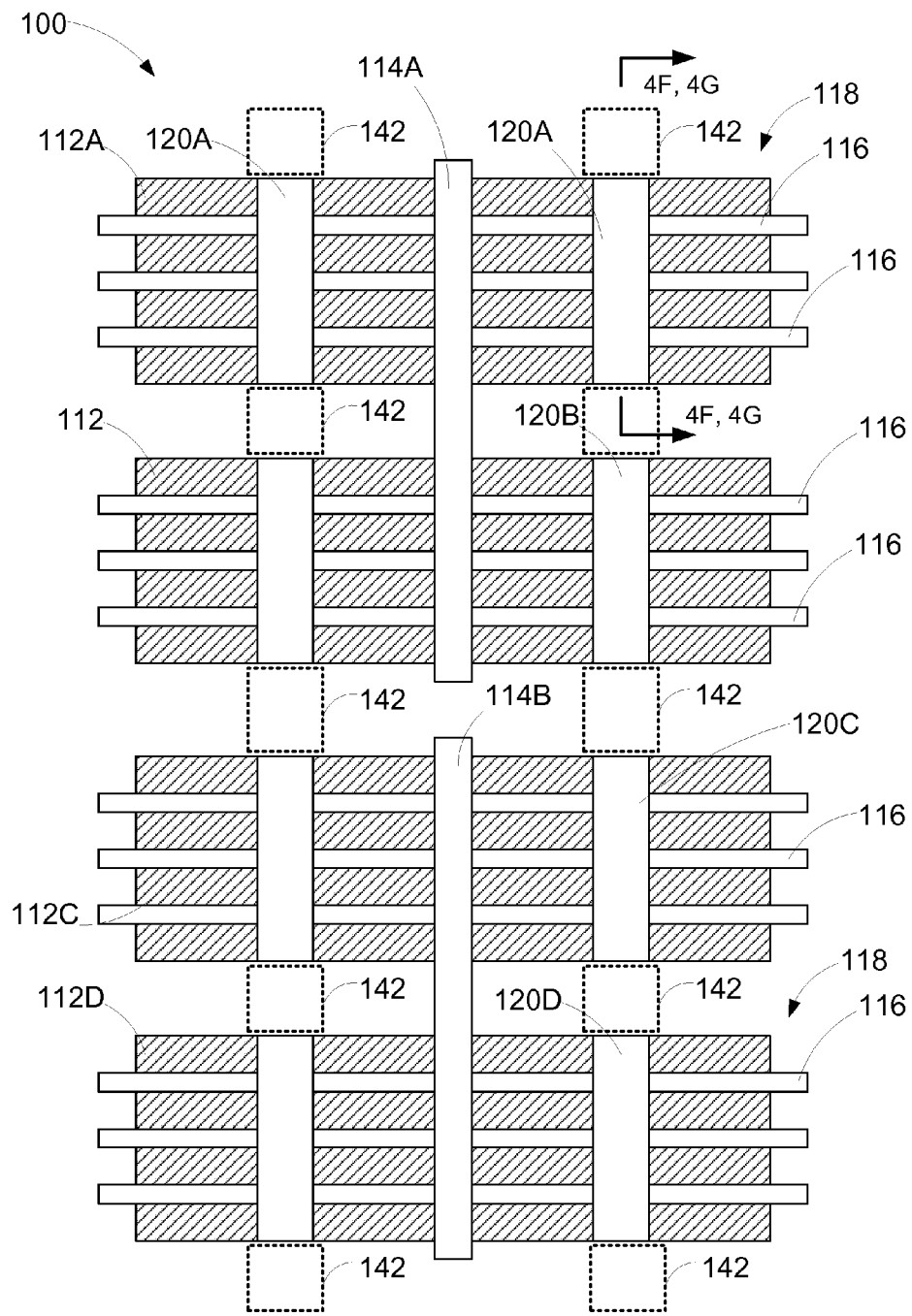
Figure 4F:
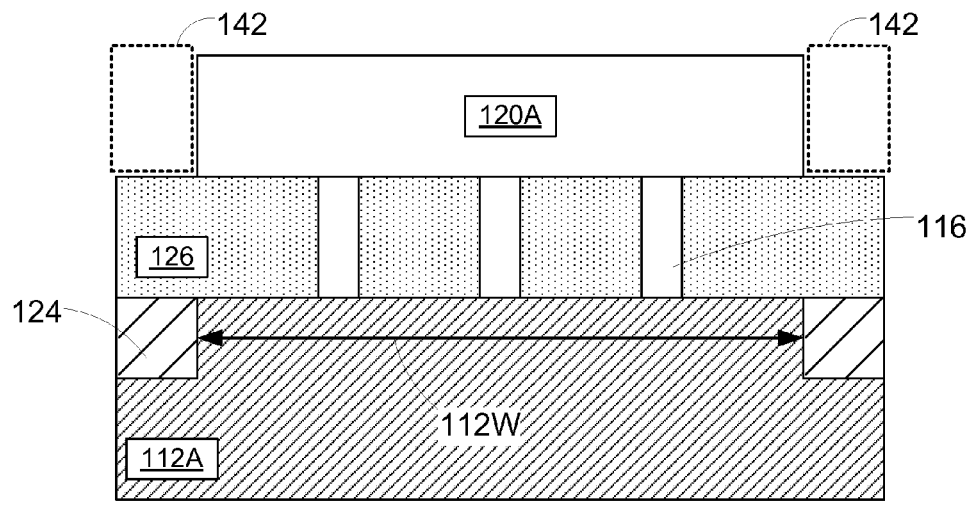

Next, as shown in FIGS. 4E-4F, the single lines of conductive material 120 may be cut into the individual unitary conductive source/drain contact structures 120A-D. This may be accomplished by forming a second patterned etch mask (not shown), e.g., a patterned layer of photoresist, above the device 100, and thereafter performing an etching process through the second patterned etch mask to cut the single lines of conductive material 120 in the areas indicated by the dashed lines 142. This second patterned etch mask may be referred to as a "contact-cut" mask. As best seen in FIG. 4F, in one illustrative embodiment, each of the resulting unitary conductive source/drain contact structures 120A-D, e.g., the conductive structure 120A, spans substantially the entire width 112W of their associated active region, e.g., the active region 112A.

Figure 4G:
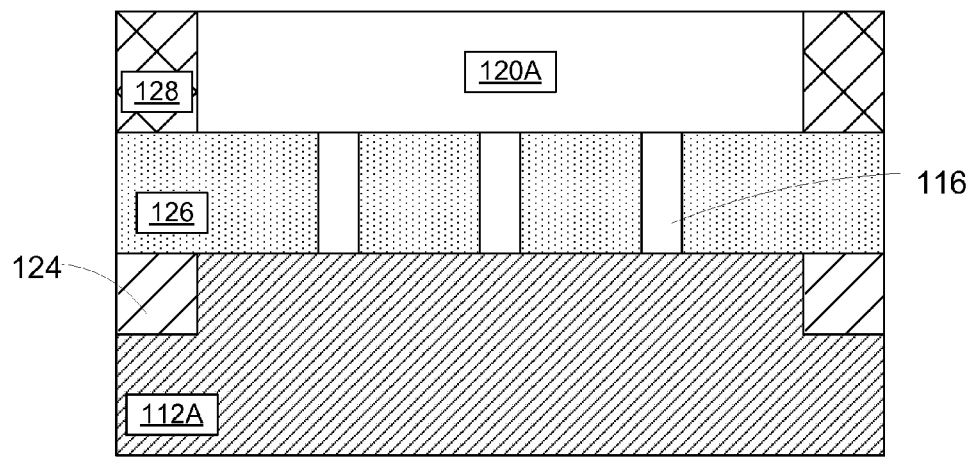

FIG. 4G depicts the device 100 at a point where the layer of insulating material 128 has been deposited and a planarization process has been performed on the layer of insulating material 128 to arrive at the structure depicted in FIG. 4G. At this point, gate contacts 123 (see FIG. 3C) may be formed to establish electrical contact to the gate structures 114A, 114B. Thereafter, V0 layer may be formed above the device so as to have a plurality of conductive vias that may contact the unitary conductive source/drain contact structures 120A-D and the gate contacts 123. The metallization layer M1 is then formed on the device.

As will be appreciated by those skilled in the art after a complete reading of the present application, the inventions disclosed herein provide several advantages over the prior art technique described in the background section the application. For example, at the point of processing depicted in FIG. 4G, conductive contact has been established with the source/drain regions 118 via contact by the unitary conductive source/drain contact structures 120A-D. However, using the novel techniques disclosed herein, this was accomplished using only two masking layers as opposed to the three masking layers required to form the conductive structures 20 and 22 using the prior art technique described in the background section of this application to arrive at the same point in the process flow. More specifically, in the novel methods depicted in FIGS. 4A-4G, the two masking layers are: the first masking layer used to pattern the long, un-cut lines of conductive material 120 and a second masking layer—the contact-cut mask layer—that was used to cut the long lines of conductive material 120 so as to form the individual unitary conductive source/drain contact structures 120A-D. That is, using the novel methods disclosed herein, the novel device 100 may be manufactured using one less masking layer as compared to the prior art technique discussed in the background section of this application. Saving masking layers in semiconductor manufacturing may result in a significant savings in processing time, complexity and costs. For example, saving one masking layer using the methods disclosed herein may result in reduction in the total die cost of about 1-2%.

Another benefit of the presently disclosed inventions relates to a decrease in the amount of "real-estate" or "plot space" occupied on the substrate by the product 100 described herein versus the prior art product 10 described in the background section of this application. More specifically, the tip-to-tip spacing 32 (see FIG. 1A) between the conductive structures 22 acts to limit efforts to reduce the overall length (also sometimes referred to as cell "height") of the device 10. Typically, the spacing 32 is set at the minimum spacing between adjacent features, e.g., the features 22B and 22C, such that all of the eight features 22 can be formed using a single masking layer. In one example, the tip-to-tip spacing 32 may be on the order of about 74 nm. If the tip-to-tip spacing 32 were to be less than this minimum value, then all eight of the conductive structures 22 could not be formed using a single masking layer. In such a situation, formation of the eight conductive structures 22 would require using double patterning techniques that would involve two separate masking layers. As noted above, the use of additional masking layers when manufacturing semiconductor products results in increased processing time, complexity and costs. Thus, using the prior art methods discussed above, semiconductor manufacturers simply set the tip-to-tip spacing 32 at the minimum value that may be patterned using their existing photolithography equipment and live with the results in terms of the amount of semiconductor "real estate" consumed by the prior art product 10. As a result, the prior art product 10 was limited to an 8T configuration that could not be further reduced in size.

Figure 5:
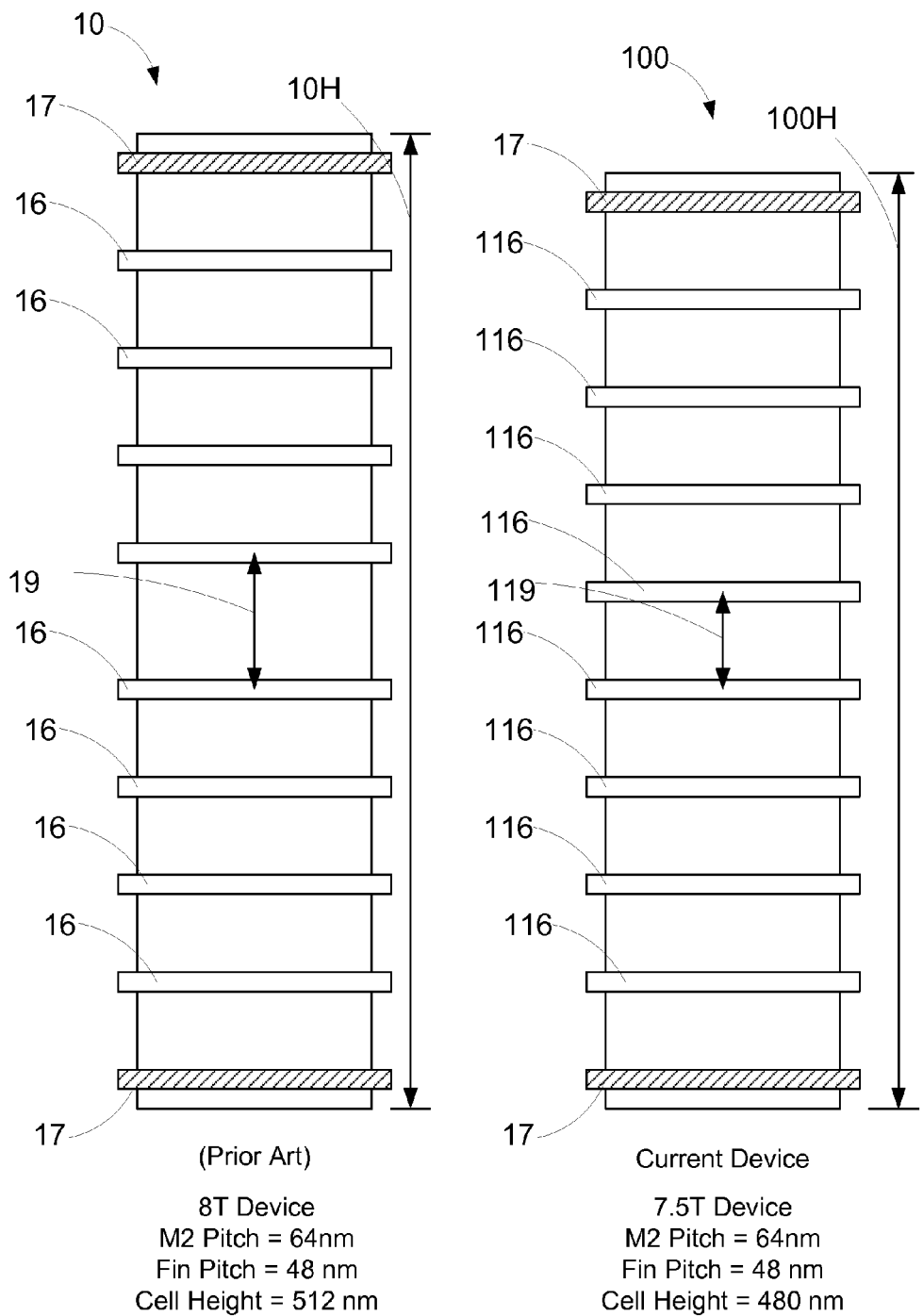
FIG. 5 is a comparison of cell heights for the novel device disclosed herein and the prior art device 10 discussed in the background section of this application.

FIG. 5 is a simplistic drawing showing the difference in cell height for the prior art device 10 discussed (comprised of active fins 16) in the background section of this application and the novel device 100 disclosed herein (comprised of fins 116). Typically, in forming either of the devices 10, 100, a number of "dummy" fins 17 were formed in an effort to produce more uniform final fin structures 16, 116. In general, the number of "tracks" on such a device is defined by the M2 pitch in the M2 metallization layer. For example, the prior art device 10 had an M2 pitch of 64 nm and a 48 nm fin pitch. Thus, the overall cell height 10H of the prior art device 10 was 512 nm (8×64). With a 48 nm pitch, this resulted in excess centerline spacing between the two inner most fins 16 (512 nm/48 nm=spacing for 10 fins+32 nm). Thus, the centerline spacing 19 between the two inner most fins 16 on the prior art device 10 was about 80 nm (32 nm+48 nm). This non-uniform spacing between the fins 16 nearest the spacing 19 as compared to the other fins 16 resulted in the formation of fins that exhibit more variations which, in turn, causes variations in the performance of the resulting FinFET devices.

In contrast, using the unique methods disclosed herein, the separate conductive structures corresponding to the structures 22A-D in FIG. 1A have been omitted by virtue of the formation of the unitary conductive source/drain contact structures 120A-D described above. Accordingly, the constraint caused by the minimum spacing requirement 32 noted above is no longer present in the device 100 disclosed herein. In the device 100, the tip-to-tip spacing 121 (see FIG. 3A) between adjacent unitary conductive source/drain contact structures 120A-D may be about 40 nm as compared to the 74 nm spacing 32 between the conductive structures 22 on the prior art device. Thus, the overall cell height 100H (see FIG. 5) may be reduced as compared to the overall cell height 10H of the prior art product 10, i.e., a 7.5T device versus the prior art 8T device. More specifically, the overall cell height may be reduced by 32 nm, thereby resulting in the reduced cell height 100H being 480 nm, which allows for the formation of ten uniformly spaced fins 116/dummy fins 17. This uniform spacing 119 between the fins 116 results in the formation of more uniform fins 116, which, in turn, results in less variations in the performance of the resulting FinFET devices.

The size reduction—from 8T to 7.5T—effectively results in approximately a 6% reduction in the area occupied by logic devices formed on the substrate—which results in a more densely packed integrated circuit product. A reduction in power consumption on the order of about 3-5% may also be realized using the novel device 100 disclosed herein as compared to the prior art design due to the reduction in area occupied by the logic devices, since power scaling is very approximately about the square root of area scaling, i.e., a reduction of about 2-2.5%. Additionally, the reduction in device capacitance due to the height reduction of the contacts will further reduce the power consumption of the device as compared to the prior art device. Other advantages will be appreciated by those skilled in the art after a complete reading of the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming first and second transistor devices in and above adjacent first and second active regions that are separated by an isolation region formed in a semiconductor substrate, said first and second transistors comprising at least one source/drain region and a shared gate structure:
forming a continuous conductive line that spans across said isolation region, wherein said continuous conductive line contacts said at least one source/drain region of each of said first and second transistors; and
performing an etching process through a patterned mask layer on said at least one continuous conductive line to form separated first and second unitary conductive source/drain contact structures, wherein said first unitary conductive source/drain contact structure contacts only said at least one source/drain region of said first transistor and said second unitary conductive source/drain contact structure contacts only said at least one source/drain region of said second transistor.

2. The method of claim 1, further comprising forming a via layer comprised of first and second conductive vias that contact said first and second unitary conductive source/drain contact structures, respectively.

3. The method of claim 1, wherein said first transistor is an NFET transistor and said second transistor is a PFET transistor.

4. The method of claim 1, wherein said first and second transistors are FinFET transistors.

5. The method of claim 1, further comprising forming a gate contact structure that is conductively coupled to said common gate structure.

6. The method of claim 5, wherein, after forming said gate contact structure, the method further comprises forming a via layer comprised of first, second and third conductive vias that contact said first and second unitary conductive source/drain contact structures and said gate contact structure, respectively.

7. The method of claim 1, wherein said unitary conductive source/drain contact structure is positioned in a single layer of insulating material.

8. A method, comprising:
forming first and second transistor devices in and above adjacent first and second active regions that are separated by an isolation region formed in a semiconductor substrate, said first and second transistors comprising at least one source/drain region and a shared gate structure;
performing a first etching process through a first patterned mask layer to form a continuous conductive line that spans across said isolation region, wherein said continuous conductive line contacts said at least one source/drain region of each of said first and second transistors;
removing said first patterned mask layer; and
performing at least one second etching process through a second patterned mask layer on said at least one continuous conductive line to form separated first and second unitary conductive source/drain contact structures, wherein said first unitary conductive source/drain contact structure contacts only said at least one source/drain region of said first transistor and said second unitary conductive source/drain contact structure contacts only said at least one source/drain region of said second transistor.

9. The method of claim 8, further comprising forming a via layer comprised of first and second conductive vias that contact said first and second unitary conductive source/drain contact structures, respectively.

10. The method of claim 8, further comprising forming a gate contact structure that is conductively coupled to said common gate structure.

11. The method of claim 10, wherein, after forming said gate contact structure, the method further comprises forming a via layer comprised of first, second and third conductive vias that contact said first and second unitary conductive source/drain contact structures and said gate contact structure, respectively.

12. The method of claim 8, wherein said first and second unitary conductive source/drain contact structures are positioned in a single layer of insulating material.

13. A method, comprising:
forming first, second, third and fourth spaced-apart active regions in a semiconductor substrate;
forming first, second, third and fourth transistor devices in and above said first, second, third and fourth active regions, respectively, wherein each of said transistors comprises at least one source/drain region;
forming a first shared gate structure for said first and second transistors above said first and second active regions;
forming a second shared gate structure for said third and fourth transistors above said third and fourth active regions;
performing a first etching process through a first patterned mask layer to form a continuous conductive line that spans across said first, second, third and fourth active regions, wherein said continuous conductive line contacts said at least one source/drain region of each of said first, second, third and fourth transistors;
removing said first patterned mask layer;
performing at least one second etching process through a second patterned mask layer on said at least one continuous conductive line to form a plurality of separated unitary conductive source/drain contact structures, wherein each unitary conductive source/drain contact structure spans respective width of the first, second, third, and fourth active regions;
removing said second patterned mask layer;
performing at least one third etching process through a third patterned mask layer to form a first gate contact structure that is conductively coupled to said first shared gate structure and to form a second gate contact structure that is conductively coupled to said second gate shared gate structure; and
forming a via layer comprised of a plurality of conductive vias that collectively contact said plurality of unitary conductive source/drain contact structures and said first and second gate contact structures.

14. The method of claim 13, further comprising forming a metallization layer on the plurality of conductive vias.

15. The method of claim 13, wherein said plurality of unitary conductive source/drain contact structures are positioned in a single layer of insulating material.

* * * * *